(12) United States Patent
Le et al.

(10) Patent No.: US 6,768,679 B1
(45) Date of Patent: Jul. 27, 2004

(54) SELECTION CIRCUIT FOR ACCURATE MEMORY READ OPERATIONS

(75) Inventors: Binh Q. Le, San Jose, CA (US);
Michael Achter, Sunnyvale, CA (US);
Lee Cleveland, Santa Clara, CA (US);
Pauling Chen, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 11 days.

(21) Appl. No.: 10/361,378

(22) Filed: Feb. 10, 2003

(51) Int. Cl.[7] .............................................. G11C 16/06
(52) U.S. Cl. .......................... 365/185.21; 365/185.25; 365/203
(58) Field of Search ...................... 365/185.21, 185.25, 365/203

(56) References Cited

U.S. PATENT DOCUMENTS

| | | | |
|---|---|---|---|
| 6,525,969 B1 * | 2/2003 | Kurihara et al. | 365/185.25 |
| 6,529,412 B1 * | 3/2003 | Chen et al. | 365/185.21 |
| 2003/0156457 A1 * | 8/2003 | Ooishi | 365/185.21 |

* cited by examiner

Primary Examiner—Huan Hoang
(74) Attorney, Agent, or Firm—Farjami & Farjami LLP

(57) ABSTRACT

A selection circuit for sensing current in a target cell during a memory read operation is disclosed. According to one embodiment, the selection circuit comprises a sensing circuit selector connected to a sensing circuit and a ground selector connected to ground. The ground selector connects a first bit line of the target cell to ground, and the sensing circuit selector connects a second bit line of the target cell to the sensing circuit. The sensing circuit selector also connects a third bit line of a first neighboring cell to the sensing circuit. The first neighboring cell shares the second bit line with the target cell.

25 Claims, 5 Drawing Sheets

SELECTION CIRCUIT FOR ACCURATE MEMORY READ OPERATIONS

TECHNICAL FIELD

The present invention relates generally to the field of semiconductor devices. More particularly, the present invention relates to semiconductor memory devices.

BACKGROUND ART

Memory devices are known in the art for storing data in a wide variety of electronic devices and applications. Electronic memory, for example, is widely used in a variety of commercial and consumer electronic products. A typical memory device comprises a number of memory cells. Often, memory cells are arranged in an array format, where a row of memory cells corresponds to a word line and a column of memory cells corresponds to a bit line, and where each memory cell defines a binary bit, i.e., either a zero ("0") bit or a one ("1") bit. For example, a memory cell may be defined as either being a "programmed" cell or an "erased" cell. According to one particular convention, a programmed cell is representative of a "0" bit, and an erased cell is representative of a "1" bit. In one type of memory cell, each cell stores two binary bits, a "left bit" and a "right bit." The left bit can represent a "0" or a "1" while the right bit can represent a "0" or a "1" independent of the left bit.

Typically, the state of a memory cell is determined during a read operation by sensing the current drawn by the memory cell. For example, to ascertain the current drawn by a particular memory cell, the drain terminal of the memory cell is connected to a sensing circuit, the source terminal of the memory cell is connected to ground, and the gate of the memory cell is selected. The sensing circuit attempts to detect the current drawn by the memory cell, and compares the sensed memory cell current against a reference current. If the sensed memory cell current exceeds the reference current, the memory cell is considered an erased cell (corresponding to a "1" bit). However, if the sensed memory cell current is below the reference current, the memory cell is considered a programmed cell (corresponding to a "0" bit).

In practice, it is desirable to have the sensed memory cell current be greater than or less than the reference current by a "read margin." In the present application, read margin is defined as the absolute value of the difference between current drawn by a target memory cell and the current drawn by a reference cell during a read operation. With a sufficient read margin, the impact of extraneous factors, such as noise, for example, upon the detection of the memory cell current is greatly reduced. For instance, suppose the reference current used for comparison is fifteen (15) microAmps ($\mu A$) in a particular memory device. In this case, it would be desirable to sense a memory cell current of twenty (20) $\mu A$ or greater for an erased cell (corresponding to a "1" bit) and a memory cell current of ten (10) $\mu A$ or less for a programmed cell (corresponding to a "0" bit). With a five (5) $\mu A$ read margin, the impact of extraneous factors, such as noise, is significantly reduced.

Conventional memory selection circuits, however, considerably reduce the read margin for sensing memory cell current during read operations (in the present application, reduction of the read margin is also referred to as "read margin loss"). When the read margin is significantly reduced, the reliability of sensing the memory cell current also decreases, since extraneous factors, such as noise, have a greater impact. The reliability of the read operation is thus reduced, resulting in poor performance of the memory device. Accordingly, there exists a strong need in the art to overcome deficiencies of known memory selection circuits and to provide a memory selection circuit and technique which results in reduced read margin loss in a fast and accurate manner during memory read operations.

SUMMARY

The present invention is directed to a selection circuit for accurate memory read operations. The invention addresses and resolves the need in the art for a selection circuit which results in reduced read margin loss in a fast and accurate manner during memory read operations. According to one exemplary embodiment, the selection circuit for sensing current in a target cell during a memory read operation comprises a sensing circuit selector connected to a sensing circuit and a ground selector connected to ground. In the exemplary embodiment, the ground selector connects a first bit line of the target cell to ground, and the sensing circuit selector connects a second bit line of the target cell to the sensing circuit. The sensing circuit selector also connects a third bit line of a first neighboring cell to the sensing circuit. The first neighboring cell shares the second bit line with the target cell. Each of the target cell and the first neighboring cell comprises a respective gate terminal connected to a common word line. In some embodiments, the target cell may also store a first bit and a second bit.

According to another exemplary embodiment, the sensing circuit selector connects a fourth bit line of a second neighboring cell to the sensing circuit during the read operation. In this particular embodiment, the second neighboring cell is adjacent to the first neighboring cell and shares the third bit line with the first neighboring cell. According to another exemplary embodiment, the selection circuit further comprises a precharge circuit selector connected to a precharge circuit. In this particular embodiment, the precharge circuit selector connects a fifth bit line of a third neighboring cell to the precharge circuit during the read operation. The third neighboring cell is adjacent to the second neighboring cell and shares the fourth bit line with the second neighboring cell.

According to another exemplary embodiment, the precharge circuit selector further connects a sixth bit line of a fourth neighboring cell to the precharge circuit during the read operation. In this particular embodiment, the fourth neighboring cell is adjacent to the third neighboring cell and shares the fifth bit line with the third neighboring cell. According to another exemplary embodiment, the precharge circuit selector connects a seventh bit line of a fifth neighboring cell to the precharge circuit during the read operation. In this particular embodiment, the fifth neighboring cell is adjacent to the fourth neighboring cell and shares the sixth bit line with the fourth neighboring cell.

According to another exemplary embodiment, the ground selector connects an eighth bit line of a sixth neighboring cell to ground during the read operation. In this particular embodiment, the sixth neighboring cell is adjacent to the target cell and shares the first bit line with the target cell. Other features and advantages of the present invention will become more readily apparent to those of ordinary skill in the art after reviewing the following detailed description and accompanying drawings.

DETAILED DESCRIPTION OF THE INVENTION

The present invention is directed to a selection circuit for accurate memory read operations. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. In the description that follows, references will be made to one particular convention where a programmed state is representative of a "0" bit, and an erased state is representative of a "1" bit, although the present invention is also suitable for use with alternative conventions.

Figure 1A:
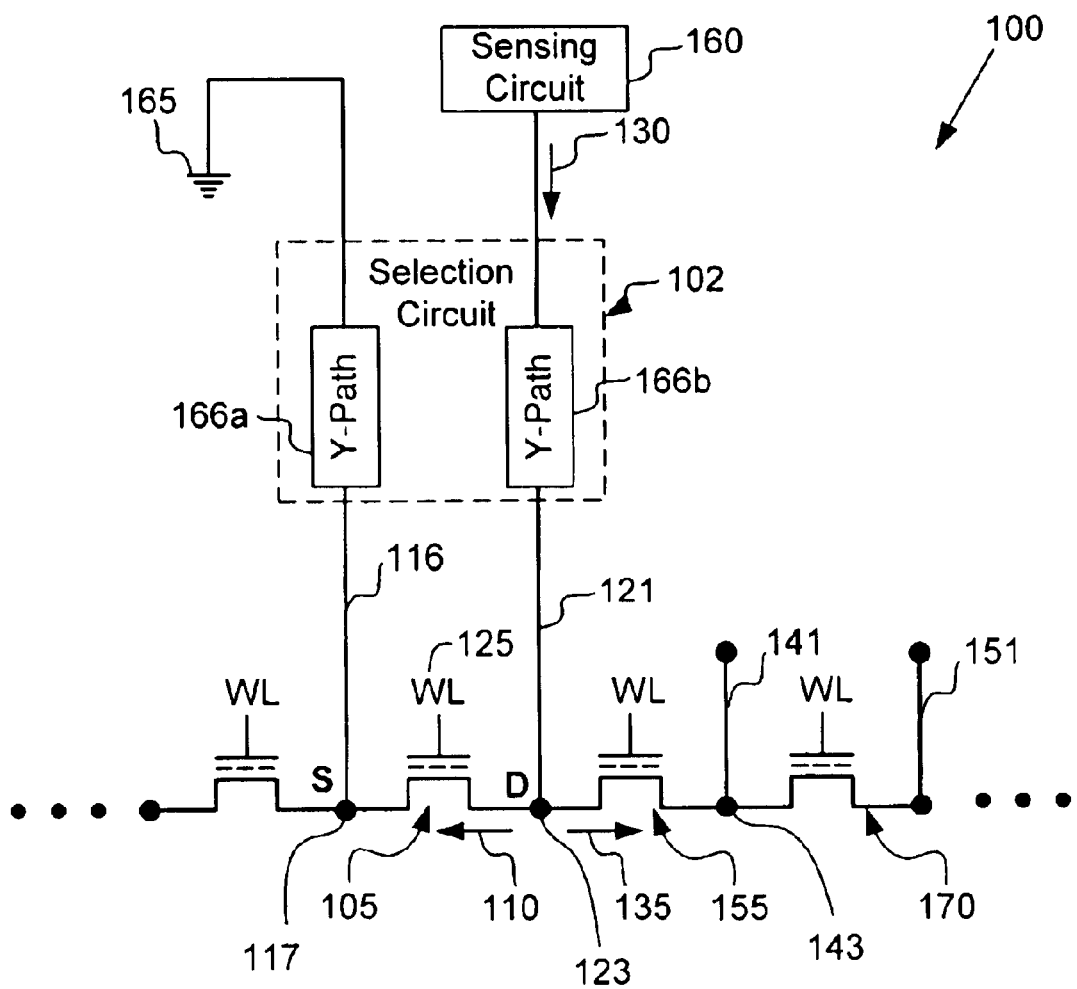
FIG. 1A depicts a circuit diagram of a known memory circuit arrangement achieved by a known selection circuit.
Figure 1B:
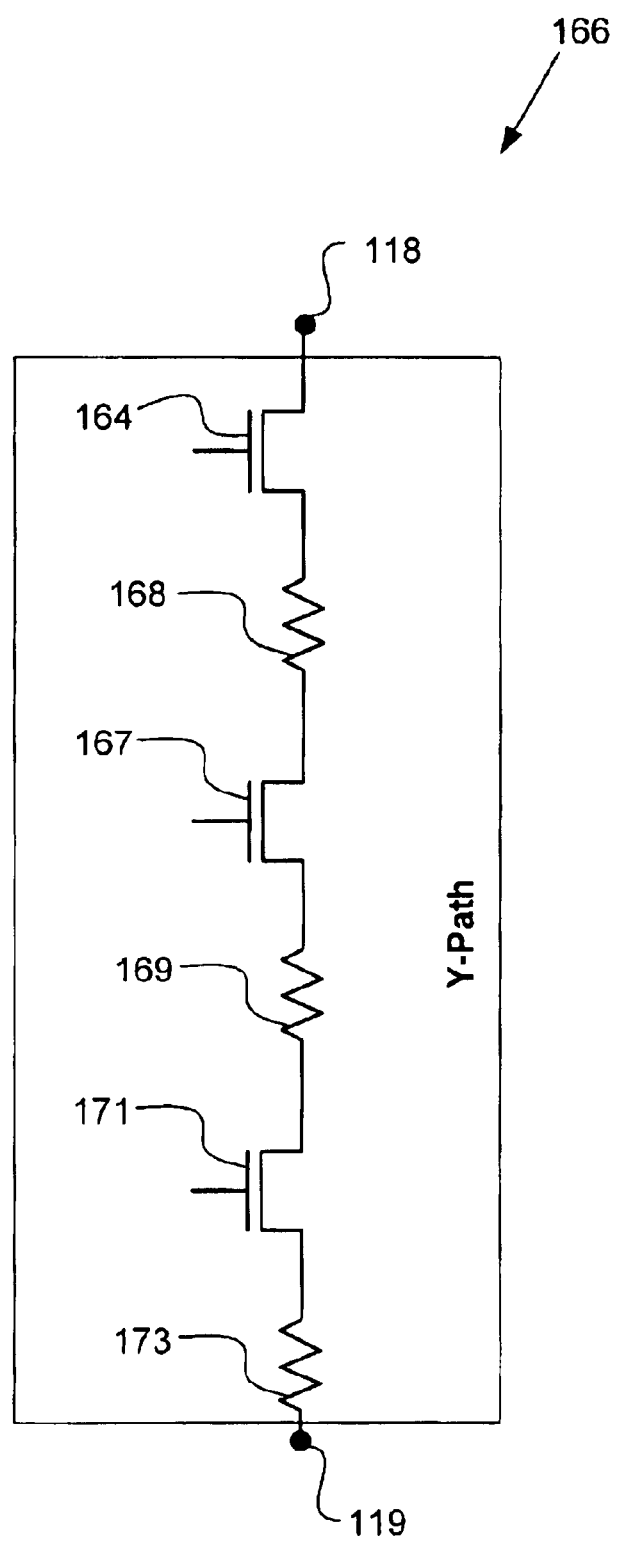
FIG. 1B depicts a simplified Y-decoder or Y-select path, designated as Y-Path.
Figure 2:
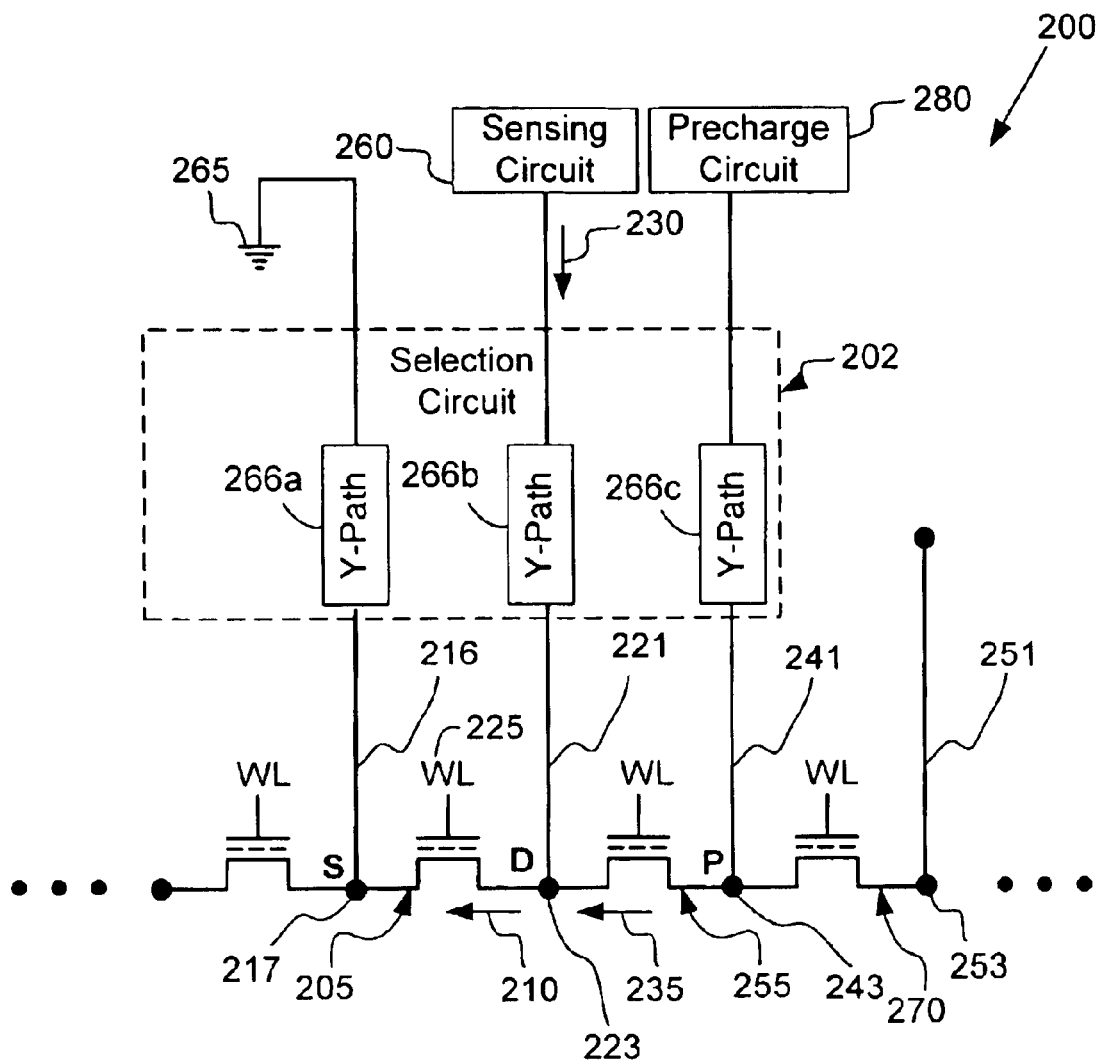
FIG. 2 depicts a circuit diagram of a known memory circuit arrangement achieved by another known selection circuit.

To illustrate the features and advantages of the present invention by way of contrast, a brief description of known selection circuitry is provided with reference to FIGS. 1A, 1B and 2. Referring first to FIG. 1A, there is shown a circuit diagram of known memory circuit arrangement 100 achieved by known selection circuit 102. Known memory circuit arrangement 100 corresponds to a portion of a memory device. In the particular arrangement shown in FIG. 1A, bit lines 116 and 121 are connected to circuitry and/or contacts by selection circuit 102 in a manner so as to sense memory cell current 110 drawn by memory cell 105. Selection circuit 102 may establish these connections when a read operation involving memory cell 105 is to be performed, for example. As shown in FIG. 1A, bit line 121 is configured as a "drain" bit line (designated "D" in FIG. 1A) by selection circuit 102 by connecting node 123 to sensing circuit 160 through Y-Path 166b. Bit line 116 is configured as a "source" bit line (designated "S" in FIG. 1A) by selection circuit 102 by coupling node 117 to ground 165 through Y-Path 166a. Y-Paths 166a and 166b establish connections for bit lines 116 and 121, respectively, in circuit arrangement 100 and can, for brevity, be represented by simplified Y-Path 166 as shown in FIG. 1B. FIG. 1B depicts a simplified "Y-decoder" or "Y-select path," referred to simply as "Y-Path" 166. In FIG. 1B, Y-Path 166 provides a connection between node 119 and node 118 through resistor 173, transistor 171, resistor 169, transistor 167, resistor 168, and transistor 164, when transistors 171, 167 and 164 are activated, e.g., by providing activation signals to respective gates of transistors 171, 167 and 164. Resistors 173, 169 and 168 represent resistance due to global metal bit lines and diffusion bit line.

Continuing with reference to FIG. 1A, bit lines 141 and 151 are "floating" and may have a pattern-dependant path to ground through neighboring memory cells. Word line 125 (designated "WL" in FIG. 1A) is connected to the gate terminal of memory cell 105 and is utilized to activate memory cell 105. When memory cell 105 is activated, the amount of current 110 drawn by memory cell 105 indicates the "programmed" or "erased" status of memory cell 105. In the present exemplary embodiment, if memory cell 105 is "programmed" (i.e. representing a "0" bit), a low current, for example less 10 $\mu A$, is drawn by memory cell 105. Conversely, if memory cell 105 is "erased" (i.e. representing a "1" bit), a high current, for example greater than 20 $\mu A$, is drawn by memory cell 105.

With the connections established as shown in FIG. 1A by selection circuit 102, sensing circuit 160 senses current 130 in an attempt to ascertain memory cell current 110 through memory cell 105. However, several drawbacks are associated with this configuration. For example, when memory cell 105 is a programmed cell (corresponding to a "0" bit), leakage current 135 from node 123 to node 143 may be drawn when neighboring memory cell 155 and all its neighboring cells between memory cell 155 and ground are erased cells (corresponding to a "1" bit). Also another potential source for leakage current 135 is transient current that could be present for charging some of the bit lines for memory cells situated on the right side of memory cell 155 in FIG. 1A. As a consequence, current 130 detected by sensing circuit 160 will be the sum of memory cell current 110 and leakage current 135, effectively raising current 130 and reducing the read margin during the read operation when memory cell 105 is a programmed cell. As described above, reducing this read margin during a memory read operation reduces the reliability of the read operation.

Referring next to FIG. 2, there is shown memory circuit arrangement 200 achieved according to another known selection circuit 202. In FIG. 2, bit line 221 of memory cell 205 is configured as a "drain" bit line (designated "D" in FIG. 2) by selection circuit 202 by connecting node 223 to sensing circuit 260 through Y-Path 266b. Bit line 216 is configured as a "source" bit line (designated "S" in FIG. 2) by selection circuit 202 by coupling node 217 to ground 265 through Y-Path 266a. Word line 225 (designated "WL" in FIG. 2) is connected to the gate terminal of memory cell 205 and is utilized to activate memory cell 205. When memory cell 205 is activated, the amount of current 210 drawn by memory cell 205 indicates the "programmed" or "erased" status of memory cell 205.

In memory circuit arrangement 200, bit line 241 of neighbor cell 255 is configured as a precharge bit line (designated "P" in FIG. 2) by selection circuit 202 by connecting node 243 to precharge circuit 280 through Y-Path 266c. Bit line 251 is "floating" and may have a pattern-dependant path to ground through neighboring memory cells. Y-Path 266a through 266c can be represented by Y-Path 266 as shown in FIG. 1B and described above.

Node 243 connected to bit line 241 is supplied a precharge voltage in an effort to reduce leakage current from node 223 to node 243 when memory cell 205 is a programmed cell (corresponding to a "0" bit) and neighboring memory cell 255 is an erased cell (corresponding to a "1" bit). For example, precharge circuit 280 may provide at node 243 a voltage at about the same level as that provided at node 223 by sensing circuit 260. While supplying a precharge voltage at node 243 may help reduce leakage current from node 223 to node 243 when memory cell 205 is a programmed cell (corresponding to a "0" bit) and neighboring memory cell 255 is an erased cell (corresponding to a "1" bit), leakage current 235 from node 243 to node 223 may occur when memory cell 205 is an erased cell (corresponding to a "1" bit) and neighboring memory cell 255 is an erased cell (corresponding to a "1" bit). The reason is that when memory cell 205 is an erased cell, memory cell current 210 acts to decrease the voltage supplied at node 223 through Y-Path 266b. As a result, the difference in voltage between node 243 and node 223 acts to draw leakage current 235 from node 243 to node 223 through erased memory cell 255. In this case, sensing circuit 260 will sense current 230 corresponding to the difference between memory cell current 210 and leakage current 235, effectively reducing current 230 when memory cell 205 is an erased cell and thereby reducing the read margin during a memory read operation. As pointed out above, reducing this read margin during a memory read operation reduces the reliability of the read operation.

Figure 3:
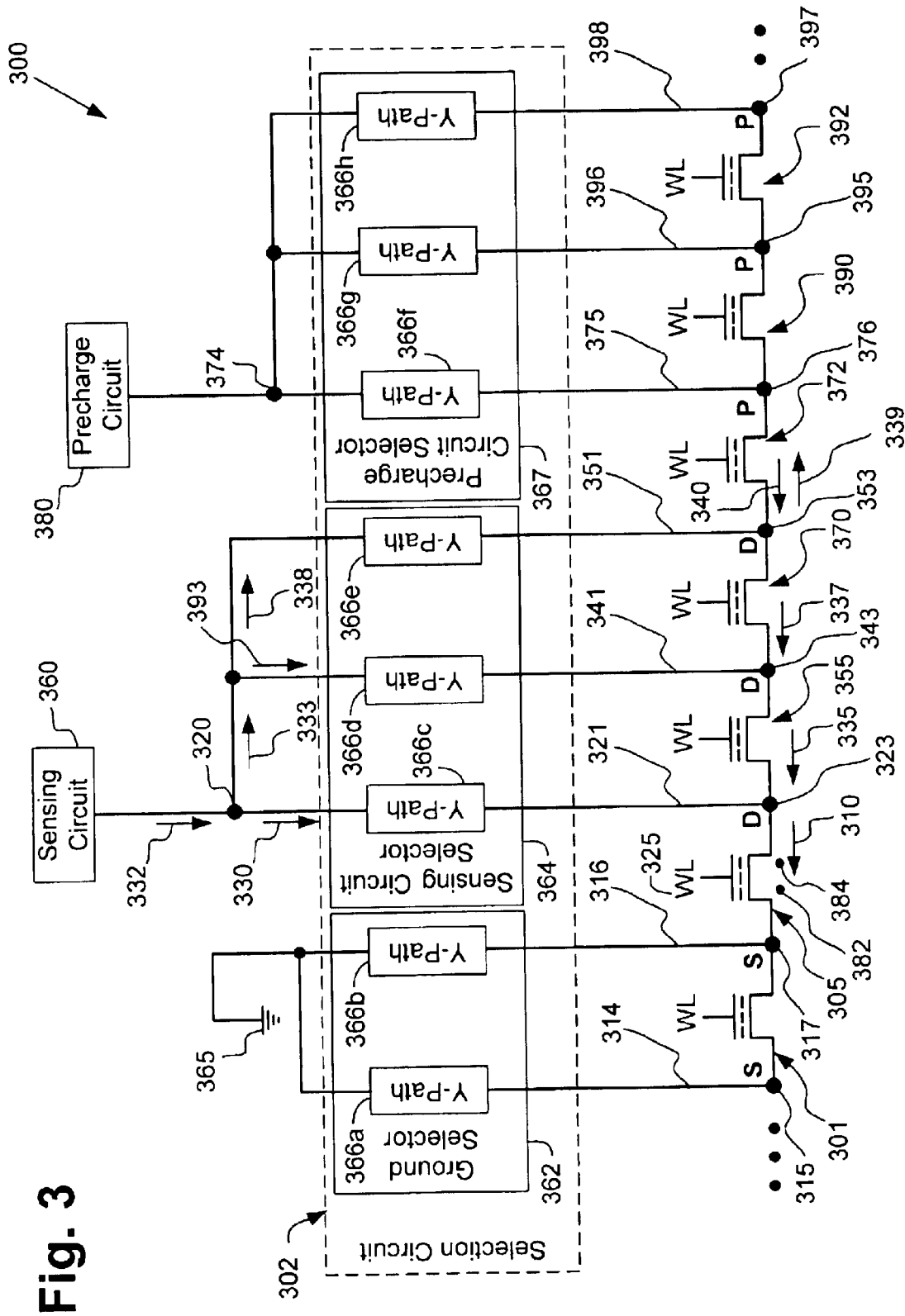
FIG. 3 depicts a functional block diagram of a selection circuit according to one embodiment of the present invention.

Referring now to FIG. 3, there is shown a functional block diagram of selection circuit 302 according to one embodiment of the present invention. As described herein, selection circuit 302 establishes memory circuit arrangement 300 corresponding to a portion of a memory device, which results in reduced read margin loss in a fast and accurate manner during memory read operations. The present invention is suitable for use with memory cells capable of storing two binary bits, a "left" bit and a "right" bit, as illustrated in the present exemplary embodiment. The left bit can represent a "0" or a "1" while the right bit can represent a "0" or a "1" independent of the left bit. However, the present invention is also suitable for use with other types of memory cells, such as those storing only a single bit, for example.

Selection circuit 302 comprises a sensing circuit selector 364, a precharge circuit selector 367, and a ground selector 362 for providing connections to sensing circuit 360, precharge circuit 380 and ground 365, respectively. Sensing circuit selector 364, precharge circuit selector 367, and ground selector 362 comprise circuitry for establishing the connections described herein, and may comprise switch devices, such as transistors controlled by column decoding logic (not shown), for example. Each Y-Path 366a through 366h as shown in FIG. 3 and described below can be represented by Y-Path 166 as shown in FIG. 1B and described above.

In the particular embodiment shown in FIG. 3, selection circuit 302 establishes connections for memory circuit arrangement 300 including adjacent memory cells 301, 305, 355, 370, 372, 390 and 392 along the same word line 325 (designated "WL" in FIG. 3). The connections depicted in FIG. 3 and described herein are established by selection circuit 302 when a read operation involving left bit 382 of memory cell 305 is to be performed. Although not described herein to preserve brevity, a similar selection circuit arrangement (not shown) can be established in accordance with the present invention when a read operation involving right bit 384 of memory cell 305 is to be performed. In the present application, memory cell 305, on which a read operation is to be performed, is also referred to as a "target cell" while each memory cell 301, 355, 370, 372, 390 and 392 adjacent to memory cell 305 is also referred to as a "neighboring cell."

In memory circuit arrangement 300, selection circuit 302 configures bit line 316 as the "source" bit line (designated "S" in FIG. 3) of memory cell 305. Thus, ground selector 362 couples node 317 to ground 365 through Y-Path 366b. Similarly, bit line 314 of neighboring memory cell 301 is also configured as a source bit line by ground selector 362 (memory cell 301 shares bit line 316 with memory cell 305). Thus, ground selector 362 couples node 315 to ground 365 through Y-Path 366a. Selection circuit 302 configures bit line 321 as the "drain" bit line (designated "D" in FIG. 3) of memory cell 305. Accordingly, sensing circuit selector 364 connects node 323 to node 320 through Y-Path 366c, where sensing circuit 360 is connected at node 320. Word line 325 is connected to the gate terminal of memory cell 305 and is utilized to activate memory cell 305 during a memory read operation. In the present example, when memory cell 305 is activated, the amount of current 310 drawn by memory cell 305 indicates the "programmed" or "erased" status of left bit 382 of memory cell 305.

Memory cell 355 neighbors memory cell 305 and shares bit line 321 with memory cell 305 at node 323. According to the present invention, bit line 341 of memory cell 355 is configured as a drain bit line by sensing circuit selector 364. More specifically, in memory circuit arrangement 300, sensing circuit selector 364 connects node 343 of bit line 341 to node 320 through Y-Path 366d. Since bit line 321 connected to node 320 is configured as a drain bit line, bit line 341, being connected to node 320, is also configured as a drain bit line and is thus connected to sensing circuit 360 through Y-Path 366d. In the same way, bit line 351 of neighbor memory cell 370 is configured as a drain bit line by sensing circuit selector 364 by connecting node 353 of bit line 351 to node 320 through Y-Path 366e. Since bit line 321 connected to node 320 is configured as a drain bit line, bit line 351, being connected to node 320, is also configured as a drain bit line and is thus connected to sensing circuit 360 through Y-Path 366e.

By configuring bit lines 341 and 351 as additional "drain" bit lines in memory circuit arrangement 300, total current 332 more accurately represents memory cell current 310 associated with left bit 382 of memory cell 305, and thus the read margin loss is significantly reduced. The following description illustrates these features of the invention. When left bit 382 of memory cell 305 is an erased bit (corresponding to a "1" bit) and neighbor memory cells 355 and 370 are erased cells (corresponding to "1" bits), leakage current 335 through neighbor memory cell 355 is largely equivalent to current 333, and leakage current 337 through neighbor memory cell 370 is largely equivalent to current 338. Thus, any reduction in current 330 due to leakage current 335 and 337 is substantially recovered since current 333 is added to current 330 though the connection of node 343 and node 320. Furthermore, current 338 is added to current 393 to form current 333, thereby compensating for leakage current 337. As a result, total current 332 being sensed by sensing circuit 360 is very close to current 310 drawn by memory cell 305.

The recovery of the leakage current through this technique results in a significantly reduced read margin loss when sensing the state of left bit 382 of memory cell 305. Using the exemplary reference current value of 15 $\mu$A, suppose memory cell current 310 is about 21 $\mu$A when memory cell 305 is an erased cell, leakage current 335 through memory cell 355 is approximately 6 $\mu$A, and leakage current 337 through memory cell 370 is 1 $\mu$A. In this case, current 330 corresponds to memory cell current 310 minus leakage current 335 and is about 15 $\mu$A. Current 333 corresponds to current 393 plus current 338. Current 393 would be about 5 $\mu$A and current 338 is approximately 1 $\mu$A, and thus current 333 would be approximately 6 $\mu$A. Thus, total current 332 detected by sensing circuit 360 would correspond to current 330 (15 $\mu$A) plus current 333 (6 $\mu$A) and would be approximately 21 $\mu$A and is very close to current 310 drawn by left bit 382 of memory cell 305. The magnitude of any additional leakage current through neighboring memory cells, e.g., current 340 through memory cell 372, is very small compared to current 310 drawn by memory cell 310, and therefore, such additional leakage current has less of an impact on total current 332. Due to the configuration established by selection circuit 302, total current 332 detected by sensing circuit 360 is very close to current 310 drawn by left bit 382 of memory cell 305 due to compensation for leakage currents 335 and 337. In addition, the desired read margin of approximately 5 $\mu$A above the reference current of 15 $\mu$A is provided.

Continuing with reference to FIG. 3, precharge circuit selector 367 configures bit lines 375, 396 and 398 of memory cells 372, 390 and 392, respectively, as "precharge" bit lines (designated "P" in FIG. 3). As such, nodes 376, 395 and 397 are connected to precharge circuit 380 through Y-Paths 366f, 366g and 366h respectively by precharge circuit selector 367. By way of example, precharge circuit 380 may supply a voltage to nodes 376, 395 and 397 at about the same level as that provided at node 353 through Y-Path 366e by sensing circuit 360.

With this configuration, the precharge voltages at nodes 376, 395 and 397 greatly reduce leakage current 339 through memory cell 372 (i.e., from node 353 to node 376), particularly when left bit 382 of memory cell 305 is a programmed bit (corresponding to a "0" bit) and when memory cell 372 and all its neighboring cells between memory cell 372 and ground are erased cells (corresponding to "1" bits), and/or when leakage current 339 is drawn through memory cell 372 due to transient current that could be present for charging some of the bit lines for memory cells situated on the right side of memory cell 392 in FIG. 3. Leakage current 339 is reduced because by providing additional precharge voltages to the right side of node 376, i.e., at nodes 395 and 397, node 376 is significantly less affected by the ground path and/or transient current path to the right side of node 397. In effect, the voltages at nodes 395 and 397 act to buffer the voltage at node 376 from the ground path and/or transient current path to the right side of node 397. Since node 376 is less affected by the ground path and/or transient current path to the right side of node 397, voltage at node 376 is close to the voltage at node 353, and thus, current 339 is significantly reduced. Thus, total current 332 detected by sensing circuit 360 is very close to memory cell current 310 drawn by memory cell 305, since leakage current 339 is greatly reduced. As a result, the read margin loss is greatly reduced in either the case where left bit 382 of memory cell 305 is a programmed bit or an erased bit, even when neighboring memory cells 355, 370, 372, 390, and 392 are erased cells. Accordingly, comparison of current 332 against a reference current (not shown) can be made with greater accuracy and reliability during a read operation involving left bit 382 of memory cell 305.

As illustrated in the exemplary embodiment of FIG. 3, the configuration of additional "drain" bit lines, e.g., bit lines 341 and 351, for neighboring memory cells, e.g., memory cells 355 and 370, reduces the read margin loss when left bit 382 of memory cell 305 is an erased bit, and when neighboring memory cells are erased cells. Yet, the configuration of additional "precharge" bit lines, e.g., bit lines 375, 396 and 398, for the neighboring memory cells, e.g., memory cells 372, 390 and 392, reduces the read margin loss when left bit 382 of memory cell 305 is a programmed bit, and when neighboring memory cells 372, 390 and 392 are erased cells. However, in other embodiments of the present invention, the number of additional "drain" bit lines, additional "precharge" bit lines and/or additional "source" bit lines may be selected in accordance with a particular desired accuracy, power budget, and access speed. For example, in some embodiments, sensing circuit selector 364 may configure only one additional "drain" bit line, and precharge circuit selector 367 may configure only two "precharge" bit lines. On the other hand, additional "drain" bit lines and "precharge" bit lines may be added for greater accuracy at the expense of additional power consumption and access speed in other embodiments.

Figure 4:
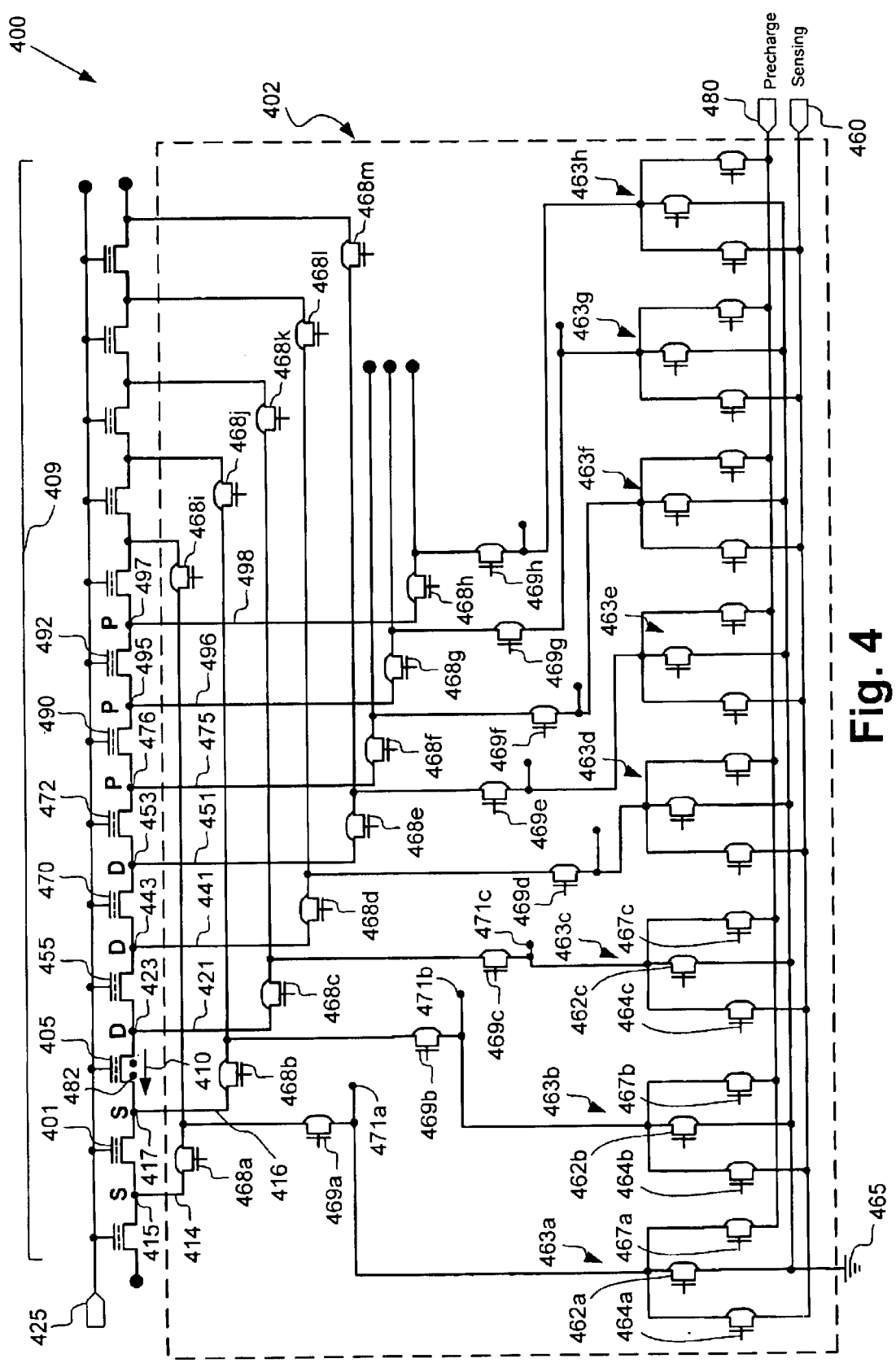
FIG. 4 depicts a circuit diagram of a selection circuit according to one embodiment of the present invention.

Referring now to FIG. 4, there is shown a circuit diagram of a selection circuit 402 according to one embodiment of the present invention. As described herein, selection circuit 402 establishes connections for a portion of memory device 400 during memory read operation involving memory cell 405. The present exemplary embodiment is suitable for use with memory cells capable of storing two binary bits, a "left" bit and a "right" bit, as illustrated in the present exemplary embodiment. The left bit can represent a "0" or a "1" while the right bit can represent a "0" or a "1" independent of the left bit. However, the present invention is also suitable for use with other types of memory cells, such as those storing only a single bit, for example.

Memory device 400 comprises a number of memory cells, although only a portion is depicted and described herein for brevity. More particularly, memory cells 401, 405, 455, 470, 472, 490 and 492 are identified as adjacent memory cells of data block 409 in memory device 400. In the particular embodiment shown in FIG. 4, data block 409 may, for example, comprise thirty-two (32) memory cells, each memory cell capable of storing two (2) bits, although only a portion of data block 409 is shown. Thus, each data block of memory device 400 is capable of storing sixty-four (64) bits.

In accordance with the present invention, selection circuit 402 establishes connections for data block 409 to a sensing circuit via node 460, to a precharge circuit via node 480, and to ground 465. In the particular embodiment depicted in FIG. 4, selection circuit 402 establishes a particular configuration for data block 409 when a read operation involving left bit 482 of memory cell 405 is to be performed.

As shown in FIG. 4, selection circuit 402 configures bit line 421 of memory cell 405 as a "drain" bit line (designated "D" in FIG. 4) and bit line 416 of memory cell 405 as a "source" bit line (designated "S" in FIG. 4). Bit line 414 of memory cell 401 is also configured as a "source" bit line as shown in FIG. 4. Selection circuit 402 further configures bit line 441 of memory cell 455 and bit line 451 of memory cell 470 as "drain" bit lines. Selection circuit also configures each bit line 475 of memory cell 472, bit line 496 of memory cell 490, and bit line 498 of memory cell 492 as a "precharge" bit line (designated "P" in FIG. 4). Word line 425 is connected to the gate terminal of each memory cell of data block 409 and is utilized to activate memory cells of data block 409 during a read operation involving a memory cell in data block 409, e.g., target cell 405. In the particular embodiment shown in FIG. 4, current 410 drawn by left bit 482 of memory cell 405 indicates the "programmed" or "erased" status of left bit 482, when memory cell 405 is activated.

As described above in conjunction with FIG. 3, configuring bit lines 441 and 451 as additional "drain" bit lines for a read operation involving left bit 482 of memory cell 405 provides compensation and recovery of any leakage current from node 443 to node 423 through memory cell 455, and from node 453 to node 443 through memory cell 470, when left bit 482 of memory cell 405 is an erased bit (corresponding to a "1" bit) and memory cells 455 and 470 are erased cells. Configuring bit lines 475, 496 and 498 as "precharge" bit lines for a read operation involving left bit 482 of memory cell 405 substantially reduces any leakage current from node 453 to node 476 through memory cell 472 when left bit 482 of memory cell 405 is a programmed bit (corresponding to a "0" bit) and memory cells 472, 490 and 492 are erased cells and/or leakage current drawn through memory cell 472 by transient current that could be present for charging some of the bit lines for memory cells situated on the right side of memory cell 492, also as described above in conjunction with FIG. 3.

Referring now to the details of selection circuit 402, the connections to the bit lines of data block 409 are controlled by a number of selectors comprising switch devices, such as transistors, for example. As shown in FIG. 4, selection circuit 402 comprises selectors 468a through 468m and selectors 469a through 469h. Although not shown to preserve simplicity, other selectors may be provided to control other bit lines of data block 409. In addition, selection circuit 402 comprises ground selectors, sensing circuit selectors, and precharge circuit selectors formed in eight (8) selector groups 463a through 463h. For example, selector group 463a comprises ground selector 462a, sensing circuit selector 464a, and precharge circuit selector 467a. Each selector group 463b through 463h comprise a corresponding ground selector, a corresponding sensing circuit selector, and a corresponding precharge circuit selector. It is noted that selection circuit 402 can be modified by removing selectors 469a through 469h, although with this modification, the number of selector groups (e.g., selector group 463a) need be doubled.

Activation of the various selectors of selection circuit 402 is controlled by signals provided to the selectors by column decoding logic (not shown). Thus, for a given memory cell in data block 409 involved in a read operation, appropriate activation signals turn on certain selectors and turns off certain selectors, as defined, for example, by column decoding logic (not shown). In this way, the configuration described above, e.g., for target cell 405, wherein reduced read margin loss are achieved in a fast and accurate manner may be provided during a memory read operation.

To illustrate the operation of selection circuit 402, the example arrangement for sensing current 410 shown in FIG. 4 achieved in accordance with the present invention will now be described. Referring first to bit line 416 connected to node 417, bit line 416 is configured as a "source" bit line by connecting node 417 to ground 465 by turning on selectors 468b, 469b and 462b, and turning off selectors 468j, 464b and 467b. Other selectors (not shown) may be connected to node 471b and would also be turned off. Similarly, bit line 414 connected to node 415 is configured as a "source" bit line by connecting node 415 to ground 465. This connection is achieved by turning on selectors 468a, 469a and 462a, and turning off selectors 468i, 464a, 467a and other selectors connected to node 471a. Bit line 421 connected to node 423 is configured as a "drain" bit line by connecting node 423 to a sensing circuit via node 460 by turning on selectors 468c, 469c and 464c, and turning off selectors 468k, 462c, 467c, and other selectors connected to node 471c. Remaining bit lines 441, 451, 475, 496, 498 are also configured to achieve the desired arrangement wherein bit lines 441 and 451 are connected to node 460, and bit lines 475, 496 and 498 are connected to a precharge circuit through node 480. With this arrangement, selection circuit 402 results in reduced read margin loss in a fast and accurate manner for memory read operations.

Although FIG. 4 illustrates a particular embodiment of selection circuit 402, enhancements to selection circuit 402 for special cases may further be provided, including, for example, cases where the memory cell involved in the read operation is proximate to the beginning or end of data block 409. In these cases, additional selectors (not shown) may be provided to configure bit lines associated with memory cells in the neighboring data block. In addition, the arrangement of selectors in selector circuit 402 may be modified in accordance with the desired number of additional "drain" bit lines and/or "precharge" bit lines.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, the specific number of "drain" bit lines and "precharge" bit line can be modified without departing from the scope of the present invention, as noted above. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a selection circuit which results in reduced read margin loss in a fast and accurate manner for read operations has been described.

What is claimed is:

1. A selection circuit for sensing current in a target cell during a memory read operation, said selection circuit comprising:
    a ground selector connected to ground, said ground selector connecting a first bit line of said target cell to ground; and
    a sensing circuit selector connected to a sensing circuit, said sensing circuit selector connecting a second bit line of said target cell to said sensing circuit, said sensing circuit selector further connecting a third bit line of a first neighboring cell to said sensing circuit during said read operation, said first neighboring cell adjacent to said target cell, said first neighboring cell sharing said second bit line with said target cell.

2. The selection circuit of claim 1, wherein said sensing circuit selector connects a fourth bit line of a second neighboring cell to said sensing circuit during said read operation, said second neighboring cell adjacent to said first neighboring cell, said second neighboring cell sharing said third bit line with said first neighboring cell.

3. The selection circuit of claim 2, further comprising a precharge circuit selector connected to a precharge circuit, said precharge circuit selector connecting a fifth bit line of a third neighboring cell to said precharge circuit during said read operation, said third neighboring cell adjacent to said second neighboring cell, said third neighboring cell sharing said fourth bit line with said second neighboring cell.

4. The selection circuit of claim 3, wherein said precharge circuit selector connects a sixth bit line of a fourth neighboring cell to said precharge circuit during said read operation, said fourth neighboring cell adjacent to said third neighboring cell, said fourth neighboring cell sharing said fifth bit line with said third neighboring cell.

5. The selection circuit of claim 4, wherein said precharge circuit selector connects a seventh bit line of a fifth neighboring cell to said precharge circuit during said read operation, said fifth neighboring cell adjacent to said fourth neighboring cell, said fifth neighboring cell sharing said sixth bit line with said fourth neighboring cell.

6. The selection circuit of claim 5, wherein said ground selector connects an eighth bit line of a sixth neighboring cell to said ground during said read operation, said sixth neighboring cell adjacent to said target cell, said sixth neighboring cell sharing said first bit line with said target cell.

7. The selection circuit of claim 1, wherein each of said target cell and said first neighboring cell comprises a respective gate terminal connected to a common word line.

8. The selection circuit of claim 1, wherein said target cell stores a first bit and a second bit.

9. A selection circuit for sensing current in a target cell during a memory read operation, said selection circuit comprising:

first selector means for connecting a bit line to ground, said second selector means comprising a ground selector, said ground selector connecting a first bit line of said target cell to ground; and second selector means for connecting a bit line to a sensing circuit; said first selector means comprising a sensing circuit selector, said sensing circuit selector connecting a second bit line of said target cell to said sensing circuit, said sensing circuit selector further connecting a third bit line of a first neighboring cell to said sensing circuit during said read operation, said first neighboring cell adjacent to said target cell, said first neighboring cell sharing said second bit line with said target cell.

10. The selection circuit of claim 9, wherein said sensing circuit selector connects a fourth bit line of a second neighboring cell to said sensing circuit during said read operation, said second neighboring cell adjacent to said first neighboring cell, said second neighboring cell sharing said third bit line with said first neighboring cell.

11. The selection circuit of claim 10, further comprising third selector means for connecting a bit line to a precharge circuit, said third selector means comprising a precharge circuit selector connected to a precharge circuit, said precharge circuit selector connecting a fifth bit line of a third neighboring cell to said precharge circuit during said read operation, said third neighboring cell adjacent to said second neighboring cell, said third neighboring cell sharing said fourth bit line with said second neighboring cell.

12. The selection circuit of claim 11, wherein said precharge circuit selector connects a sixth bit line of a fourth neighboring cell to said precharge circuit during said read operation, said fourth neighboring cell adjacent to said third neighboring cell, said fourth neighboring cell sharing said fifth bit line with said third neighboring cell.

13. The selection circuit of claim 12, wherein said precharge circuit selector connects a seventh bit line of a fifth neighboring cell to said precharge circuit during said read operation, said fifth neighboring cell adjacent to said fourth neighboring cell, said fifth neighboring cell sharing said sixth bit line with said fourth neighboring cell.

14. The selection circuit of claim 13, wherein said ground selector connects an eighth bit line of a sixth neighboring cell to said ground during said read operation, said sixth neighboring cell adjacent to said target cell, said sixth neighboring cell sharing said first bit line with said target cell.

15. The selection circuit of claim 9, wherein each of said target cell and said first neighboring cell comprises a respective gate terminal connected to a common word line.

16. The selection circuit of claim 9, wherein said target cell stores a first bit and a second bit.

17. A selection circuit for sensing current in a target cell during a memory read operation, said selection circuit comprising a ground selector connected to ground, said ground selector connecting a first bit line of said target cell to ground, said selection circuit further comprising a sensing circuit selector connected to a sensing circuit, said sensing circuit selector connecting a second bit line of said target cell to said sensing circuit, said selection circuit being characterized by:

said sensing circuit selector further connecting a third bit line of a first neighboring cell to said sensing circuit during said read operation, said first neighboring cell adjacent to said target cell, said first neighboring cell sharing said second bit line with said target cell.

18. The selection circuit of claim 17, wherein said sensing circuit selector connects a fourth bit line of a second-neighboring cell to said sensing circuit during said read operation, said second neighboring cell adjacent to said first neighboring cell, said second neighboring cell sharing said third bit line with said first neighboring cell.

19. The selection circuit of claim 18, further comprising a precharge circuit selector connected to a precharge circuit, said precharge circuit selector connecting a fifth bit line of a third neighboring cell to said precharge circuit during said read operation, said third neighboring cell adjacent to said second neighboring cell, said third neighboring cell sharing said fourth bit line with said second neighboring cell.

20. The selection circuit of claim 19, wherein said precharge circuit selector connects a sixth bit line of a fourth neighboring cell to said precharge circuit during said read operation, said fourth neighboring cell adjacent to said third neighboring cell, said fourth neighboring cell sharing said fifth bit line with said third neighboring cell.

21. A selection circuit for sensing current in a target cell during a memory read operation, said selection circuit comprising:

a ground selector connected to ground, said ground selector connecting a first bit line of said target cell to ground;

a sensing circuit selector connected to a sensing circuit, said sensing circuit selector connecting a second bit line of said target cell to said sensing circuit; and a precharge circuit selector connected to a precharge circuit, said precharge circuit selector connecting a third bit line of a first neighboring cell to said precharge circuit during said read operation, said precharge circuit selector further connecting a fourth bit line of a second neighboring cell to said precharge circuit during said read operation, said second neighboring cell adjacent to said first neighboring cell, said second neighboring cell sharing said third bit line with said first neighboring cell.

22. The selection circuit of claim 21, wherein each of said target cell, said first neighboring cell and said second neighboring cell comprises a respective gate terminal connected to a common word line.

23. The selection circuit of claim 21, wherein said precharge circuit selector connects a fifth bit line of a third neighboring cell to said precharge circuit during said read operation, said third neighboring cell adjacent to said second neighboring cell, said third neighboring cell sharing said fourth bit line with said second neighboring cell.

24. The selection circuit of claim 23, wherein each of said target cell, said first neighboring cell, said second neighboring cell and said third neighboring cell comprises a respective gate terminal connected to a common word line.

25. The selection circuit of claim 21, wherein said target cell stores a first bit and a second bit.

* * * * *